United States Patent
Egner

(10) Patent No.: US 7,945,843 B2
(45) Date of Patent: May 17, 2011

(54) ERROR CORRECTING CODE

(75) Inventor: Sebastian Egner, Eindhoven (NL)

(73) Assignee: NXP B.V., Eindhoven (NL)

( * ) Notice: Subject to any disclaimer, the term of this patent is extended or adjusted under 35 U.S.C. 154(b) by 750 days.

(21) Appl. No.: 11/814,283

(22) PCT Filed: Jan. 12, 2006

(86) PCT No.: PCT/IB2006/050108
§ 371 (c)(1),
(2), (4) Date: Feb. 27, 2008

(87) PCT Pub. No.: WO2006/077503
PCT Pub. Date: Jul. 27, 2006

(65) Prior Publication Data
US 2008/0282132 A1   Nov. 13, 2008

(30) Foreign Application Priority Data

Jan. 18, 2005  (EP) .................................. 05100265

(51) Int. Cl.
*H03M 13/00* (2006.01)
(52) U.S. Cl. ...................................... 714/781; 714/763
(58) Field of Classification Search .................. 714/781, 714/763
See application file for complete search history.

(56) References Cited

U.S. PATENT DOCUMENTS

| | | | | |
|---|---|---|---|---|
| 4,099,160 A | * | 7/1978 | Flagg | 714/785 |
| 4,142,174 A | * | 2/1979 | Chen et al. | 714/784 |
| 5,134,619 A | * | 7/1992 | Henson et al. | 714/770 |
| 5,140,592 A | * | 8/1992 | Idleman et al. | 714/5 |
| 5,274,645 A | * | 12/1993 | Idleman et al. | 714/6 |
| 5,285,451 A | * | 2/1994 | Henson et al. | 714/6 |
| 5,754,563 A | * | 5/1998 | White | 714/757 |
| 6,148,430 A | * | 11/2000 | Weng | 714/770 |
| 6,567,891 B2 | * | 5/2003 | Oldfield et al. | 711/114 |
| 7,111,227 B2 | * | 9/2006 | Oldfield et al. | 714/801 |

OTHER PUBLICATIONS

Varshamov, R. R. "A Class of Codes for Asymmetric Channels and a Problem From the Additive Theory of Numbers" IEEE Transactions on Information Theory, vol. IT-19, No. 1, Jan. 1973, pp. 92-95.
Sloane, N. J. A. "On Single-Deletion-Correcting Codes" Information Sciences Research, AT&T Shannon Labs 180 Park Avenue, Florham Park, NJ 07932, Nov. 7, 2002, pp. 1-23.
Chen, Johnny; et al "Concatenated Codes for Deletion Channels" Proceedings of the IEEE International Symposium on Information Theory. ISIT '03. Jun. 29, 2003, pp. 218-218.
Tenengolts, G. "Nonbinary Codes, Correcting Single Deletion or Insertion (Corresp.)" IEEE Transactions on Information Theory, Sep. 1984, pp. 766-769.
Lee, Seungjae; et al "A 3.3 V 4GB Four-Level NAND Flash Memory With 90NM CMOS Technology" Solid-State Circuits Conference, 2004. Digest of Technical Papers. ISSCC 2004. Feb. 15, 2004, pp. 52-61.

* cited by examiner

Primary Examiner — Joseph D Torres

(57) ABSTRACT

A system for protecting a codeword u against an error in at least one <7-ary symbol, where q is an $r^{th}$ power of two, r>1 (q=$2^r$). The code word u includes information symbols u[0] ... u[k-1], k>1, each information symbol representing an integer in the range {0 ... 2w-1}, where w=n*r, n≧1. A processor includes an integer processing unit for, under control of a program, calculating a parity symbol u[k] for protecting the information symbols, where the parity symbol includes −(a[0]·u[0]+a[1]·u[1]+...+a[k−1]•u[k−1]) mod M, where the multiplication · and the addition + are integer operations. The constants a[0] ... a[£−1] lie in {0 ... M−1}, M>1 and are chosen such that the elements a[i]*d*$q^i$ mod M are unique for i∈{0, ... ,k−1}, j∈{0 ... n−1}, −q<d<q, d≠0.

11 Claims, 2 Drawing Sheets

ERROR CORRECTING CODE

FIELD OF THE INVENTION

The invention relates to an error correcting code, in particular to a method of generating the error correcting code, a method of calculating a parity symbol using the error correcting code and a method of using the error correcting code to correct an error in a received vector. The invention further relates to software for executing the method and to a system using the method.

BACKGROUND OF THE INVENTION

Error-correcting codes are well-known for use in storage or transmission systems to be able to detect and correct at least one error that may have occurred during the storing/reading or transmission of a word. The word (information symbol) typically includes a plurality of bits, e.g. 32 bits. One or more symbols are grouped together into a codeword. An error correcting code generates additional information that is usually referred to as a parity symbol(s). The entire code word (information symbols and parity symbol) is then stored/transmitted. Advanced error correcting codes are based on calculations in finite fields, such as Galois Fields (e.g. $GF(2^n)$). A well-known error correction code is the Reed-Solomon code. Typically the codes are calculated before storing/transmitting and checked after reading/receiving using custom-designed hardware for executing the specific finite field calculations. In many applications a microcontroller or digital signal processor is available, however these processors usually do have hardware support for such operations. In itself it is known how finite field calculations can be performed using other operations of such conventional processors, often by table lookup. For most applications that is not practically possible since performing the conventional finite field calculations using integer operations requires too many processing cycles and is thus too slow. For low-cost applications the costs of the additional specific hardware is a problem.

SUMMARY OF THE INVENTION

It is an object of the invention to provide an error correcting code that is executable on an integer processing unit and is able to correct at least one q-ary symbol in a codeword, where q is an $r^{th}$ power of two, $r \geq 1$, ($q=2^r$). In particular it is an object to be able to correct an error in a 4-ary symbol ($q=2^2$) for a 4-level memory cell such as, for example, is often used in a NAND memory.

To meet the object of the invention a method is provided of generating an error correcting code for correcting at least one q-ary symbol, where q is an $r^{th}$ power of two, $r \geq 1$, ($q=2^r$); the method includes:

using as the error correcting code a code word u that includes k information symbols $u[0], \ldots, u[k-1]$, $k>1$ and a parity symbol $u[k]$ for protecting the information symbols (for example, $u=(u[0], \ldots, u[k-1], u[k])$); each information symbol representing an integer in the range $\{0, \ldots, 2^w-1\}$, where $w=n^*r$, $n \geq 1$;

including in the parity symbol $u[k]$ a term $-(a[0] \cdot u[0]+a[1] \cdot u[1]+ \ldots +a[k-1] \cdot u[k-1]) \bmod M$, where $M \geq 2n(k+1)(q-1)+1$, where the multiplication $\cdot$ and the addition $+$ are integer operations executable by an integer processing unit and where $a[0], \ldots, a[k-1]$ are constants in $\{0, \ldots, M-1\}$; and choosing the constants $a[0], \ldots, a[k-1]$ such that the elements $a[i] \cdot d \cdot q^j \bmod M$ are unique for $i \in \{0, \ldots, k-1\}$, $j \in \{0, \ldots, n-1\}$, $-q<d<q$, $d \neq 0$.

To meet the object of the invention a system is provided for protecting a codeword u against an error in at least one q-ary symbol, where q is an r-power of two, $r \geq 1$ ($q=2^r$), the system including:

means for receiving the code word u including information symbols $u[0], \ldots, u[k-1]$, $k>1$, each information symbol representing an integer in the range $\{0, \ldots, 2^w-1\}$, where $w=n^*r$, $n \geq 1$;

a processor including an integer processing unit for, under control of a program, calculating a parity symbol $u[k]$ for protecting the information symbols, where the parity symbol includes $-(a[0] \cdot u[0]+a[1] \cdot u[1]+ \ldots +a[k-1] \cdot u[k-1]) \bmod M$, where $M \geq 2n(k+1)(q-1)+1$, where the multiplication $\cdot$ and the addition $+$ are integer operations and where $a[0], \ldots, a[k-1]$ are constants in $\{0, \ldots, M-1\}$ chosen such that the elements $a[i] \cdot d \cdot q^j \bmod M$ are unique for $i \in \{0, \ldots, k-1\}$, $j \in \{0, \ldots, n-1\}$, $-q<d<q$, $d \neq 0$; and means for adding the parity symbol $u[k]$ to the codeword u before transmitting or storing the codeword.

The code can correct one or more q-ary symbol errors and uses only integer operations (addition, multiplication and modulus). As such the code can be easily executed on conventional integer hardware. Only a few cycles are required, making the code also fast.

It should be noted that codes that are defined by a linear congruence similar to the described relationship are known in the literature as Varshamov-Tenengolts codes (1965) described in R. R. Varshamov: "A class of codes for asymmetric channels and a problem from the additive theory of numbers". IEEE Transactions on Information Theory, Vol. IT-19, No. 1, January 1973. The codes have been studied with respect to their capacity of correcting asymmetric errors (e.g. "0" may be mapped into "1" but not vice versa). It is further noted that Levenshtein has observed that these codes have properties for correcting insertions and deletions, too. However, these codes have not been considered for correcting q-ary-symbol errors due to their poor distance properties. The claimed code further deviates in that the information symbols may exceed the range specified by the modulus M ($2^w \geq M$).

According to the measure of the dependent claim 2, a table is formed that enables, for each single error in a q-ary symbol in a received vector, retrieval of information that indicates which q-ary symbol is corrupted and how it can be corrected. Using such table makes the execution fast. The table may be stored in low-cost memory, e.g. ROM.

As defined by the measure of the dependent claim 3, the modulus M is preferably chosen as the largest prime in the allowed range. This simplifies choosing suitable constants.

As defined by the measure of the dependent claim 4, suitable constants can be found by iteratively selecting and testing randomly chosen values.

As defined by the measure of the dependent claim 5, an effort is made to chose small constants that meet the requirement. Using small constants (e.g. 8-bit values) increases the processing speed on simple processors.

These and other aspects of the invention are apparent from and will be elucidated with reference to the embodiments described hereinafter.

DETAILED DESCRIPTION OF THE PREFERRED EMBODIMENT

Figure 1:
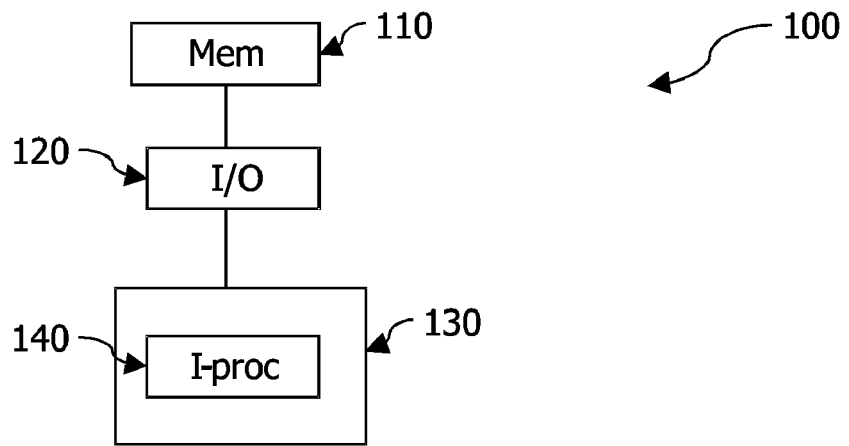
FIG. 1 shows a block diagram of an embodiment according to the invention.

FIG. 1 shows a block diagram of an embodiment of a system 100 according to the invention. In this embodiment, the system includes a processor 130 that performs the core calculations of the error correcting code (i.e. calculating the parity symbol before transmitting/storing the codeword and/or calculating the syndrome for determining an error in a received/read codeword). The method and system according to the invention are designed such that these core calculations can be performed on a conventional integer processing CPU core. In FIG. 1 such a core is shown as I-proc 140. The system also includes I/O means 120 for outputting a codeword (including parity) and/or receiving a vector that includes such a codeword possibly disturbed by one or more errors. Typically, error correction is used when a codeword is transmitted, e.g. through a communication system like a local or wide are network, or when a code word is stored in a memory/storage. During transmission or during the read and/or write operation one or more bits of the codeword may get corrupted. The error correcting code aids in detecting that an error has occurred and in correcting one or more errors. The I/O means 120 are in itself conventional depending on the type of transmission or memory/storage.

The system according to the invention is designed for correcting at least one q-ary symbol, where q is an $r^{th}$ power of two, $r \geq 1$, ($q=2^r$). In a preferred embodiment, the system includes a memory 110. Preferably, the memory is of a NAND-type where information is stored using four-distinct levels (q=4, r=2). Thus, one memory cell stores two bits of information. A defect or error in this cell thus may have an effect on the entire information stored in such a cell, i.e. the entire q-ary symbol.

In the remainder the principles of the error correcting code will be described in general terms intermixed with an example.

Figure 2A:
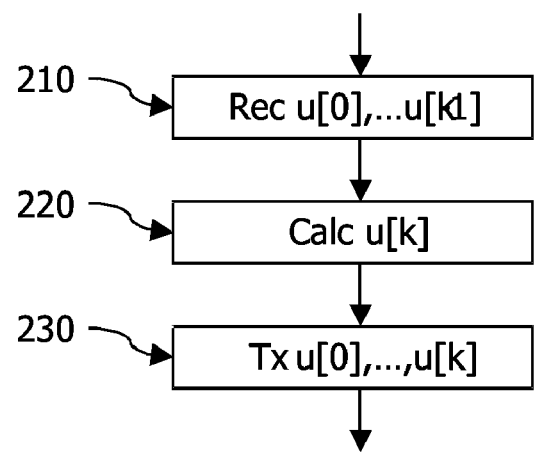
FIG. 2 illustrates the processing steps according to the invention.

FIG. 2 illustrates the processing steps according to the invention. In step 210, a a code word u is received that needs to be protected. The processor 130 may, for example, have calculated such a codeword during the execution of a program or may have received it from a source (not shown). FIG. 3 illustrates that the codeword u 300 includes k information symbols u[0], . . . , u[k−1], $k \geq 1$. The information symbols are indicated with number 310. Each information symbol represents an integer in the range $\{0, \ldots, 2^w-1\}$, where w=n*r, $n \geq 1$. In the example illustrated in FIG. 3, the code word u 300 includes 16 information symbols u[0], . . . , u[15] (thus, k=16) of each 32 bits of information (thus, w=32). The information symbols in the code word u 300 will be indicated with the index $i \in \{0, \ldots, k-1\}$. In the example, a 4-ary symbol is stored in one memory cell, giving that q=4 and r=2. Thus each information symbol includes w/r=32/2=16 q-ary symbols. For one information symbol, the sixteen q-ary symbols are indicated in FIG. 3 using number 315. A q-ary symbol within an information symbol u[i] will be indicated with an index j.

In step 220 a single parity symbol u[k] is calculated for protecting the information symbols. FIG. 3 shows the parity symbol using number 312. According to the invention, the parity symbol u[k] includes a term −(a[0]·u[0]+a[1]·u[1]+ . . . +a[k−1]·u[k−1]) mod M, where the multiplication · and the addition + are integer operations executable by an integer processing unit, such as the unit 140 of FIG. 1. For example, u[k]=−(a[0]·u[0]+a[1]·u[1]+a[k−1]·u[k−1]) mod M  (1)

The method thus protects k information symbols u[0], . . . , u[k−1] by adding a single parity symbol. The factors a[0], . . . , a[k−1] are constants in $\{0, \ldots, M-1\}$, and $M \geq 1$. The constants are chosen in a suitable way as detailed below. It will be understood that using the term (a[0]·u[0]+a[1]·u[1]+ . . . +a[k−1]·u[k−1]) mod M for the parity symbol is fully equivalent as long as the syndrome for checking/correcting the codeword is changed in an analogous way, as lies fully within the competence of a skilled person.

Step 320 in FIG. 3 illustrates that the parity symbol 312 is added to the information symbols. In a example described here, it is assumed that the parity symbol is appended and thus forms the last symbol of the composed code word. Again, this is not essential and persons skilled in the art can easily insert the parity symbol at another location or use other suitable ways of adding the information of the parity symbol to the information symbol and change the syndrome for checking/correcting the codeword in an analogous way In step 230 of FIG. 2 and step 330 of FIG. 3, the combined codeword is issued to a 'transmission channel'. As described above this may equally well be for real transmission to a communications system or for storing/retrieval in a memory. This completes the steps for protecting information, i.e. the role of the 'sender'.

Figure 2B:
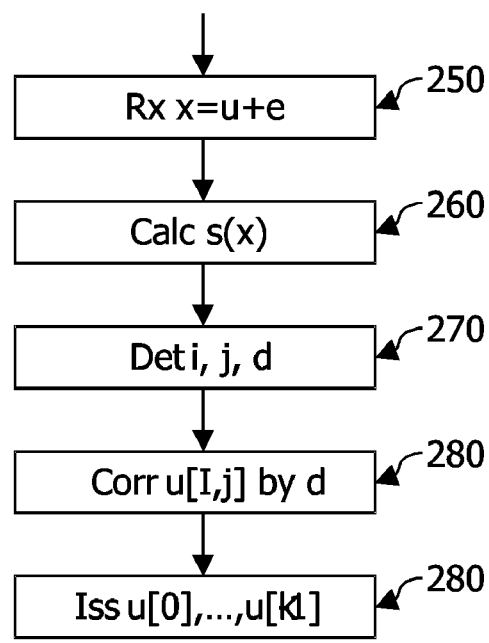
Figure 3:
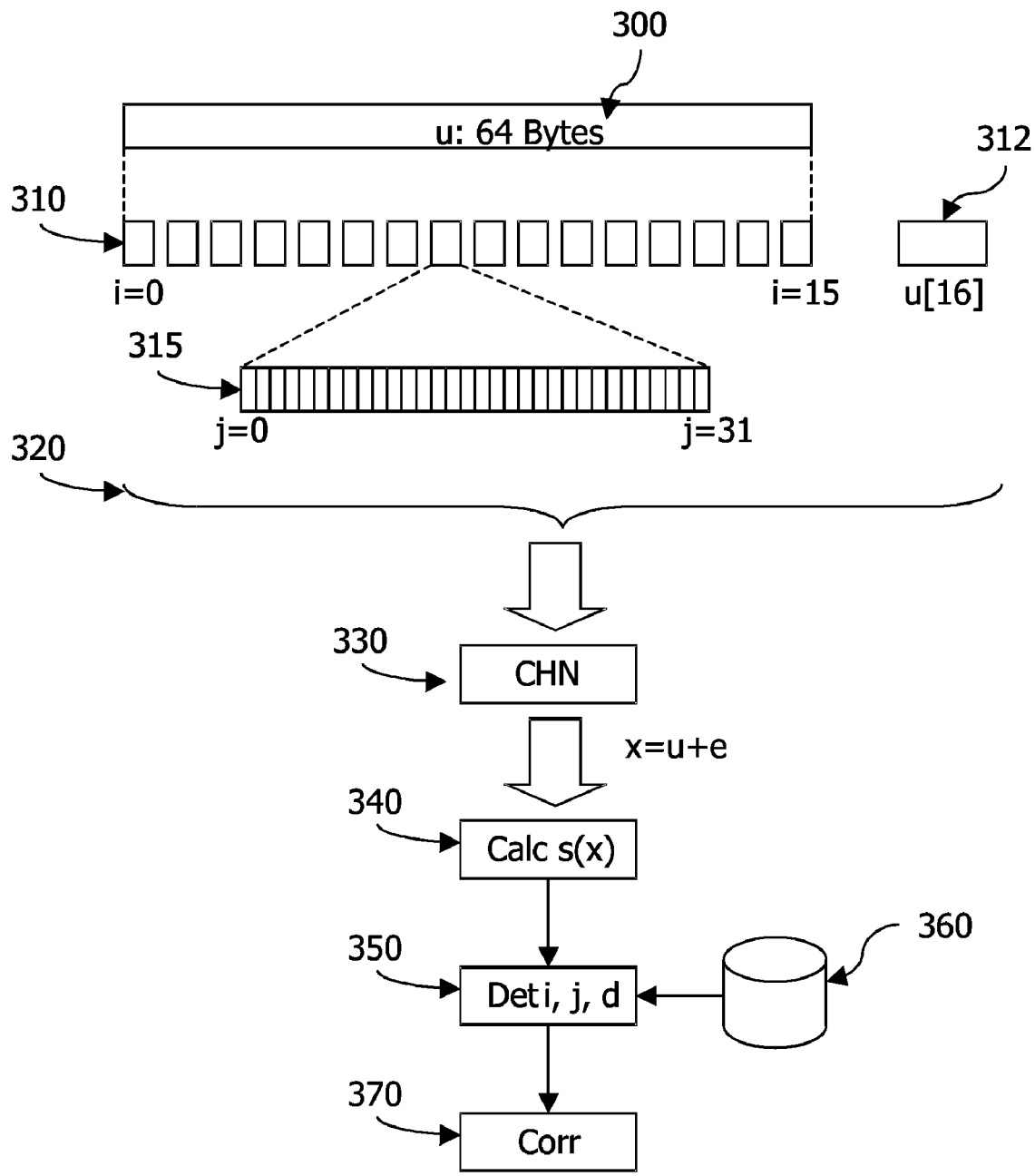
FIG. 3 provides more details on the structure of the data.

FIG. 2B and the remainder of FIG. 3 illustrate the processing in the 'receiver', i.e. the steps used to detect and correct an error that may have occurred in the transmission channel. The code word that is received will be referred to as a vector x. The transmission channel is assumed to have added an error vector e to the transmitted codeword u. It will be understood that if no error has occurred then e is a null vector with only zero-components. Thus, the transmitted codeword u is received as the vector x=u+e=(u[0]+e[0], . . . , u[k−1]+e[k−1], u[k]+e[k]), where "+" denotes the genuine integer addition, and the elements e[i] are integers (positive, negative or zero). The receipt of x is shown in step 250 of FIG. 2B and next to the arrow between blocks 330 and 340 in FIG. 3. In the next step (step 260 in FIG. 2, step 340 in FIG. 3), a syndrome of this received vector is calculated. The syndrome is defined as:

s(x)=(a[0]·x[0]+a[1]·x[1]+ . . . +a[k−1]·x[k−1]+x[k])
mod M

Since s(−) is linear over the integers, and s(u)=0 for any codeword u given by (1), this gives:

s(x)=s(u)+s(e)=s(e)=(a[0]e[0]+ . . . +a[k−1]e[k−1]+e[k]) mod M.

Hence, the syndrome s(x) of a received vector x does not depend on the information; it only depends on the additive error vector e.

The method and system according to the invention are particularly suitable for channels, such as a NAND-flash memory, that introduces q-ary-symbol errors. Consider the case in which exactly one of the q-ary symbols has been modified by the channel. Then there is exactly one i in {0 . . . k} for which e[i]≠0. Moreover, there is exactly one j such that the j-th q-ary-digit of x[i] differs from the j-th q-ary-digit of u[i]. Since a digit is in {0 . . . q−1}, the difference d of the digits is −q<d<q, d≠0 (a difference of zero would be no error). This implies that the possible values of e[i] lie in $\{d \cdot q^j | -q<d<q, d \neq 0\}$. This shows that any single q-ary-symbol error produces a syndrome of the form:

$$s(e)=a[i] \cdot d \cdot q^j \bmod M, i \in \{0, \ldots, k\}, -q<d<q, d \neq 0 \quad (2)$$

Hence, if all elements of all these syndromes are pairwise distinct, it is possible to decode the error. Thus, the constants a[0], . . . , a[k−1] are chosen such that the elements $a[i] \cdot d \cdot q^j$ mod M are pairwise distinct for $i \in \{0, \ldots, k\}, j \in \{0, \ldots, n-1\}$, −q<d<q, d≠0, where a[k]=1.

Since any integer mod M is in the range $\{0, \ldots, M-1\}$, there are M distinct values mod M. Also, there are 2n(k+1)(q−1) possibilities to choose a combination of $i \in \{0, \ldots, k\}$, j∈{0, ..., n−1}, −q<d<q, d≠0. To be able to differentiate between these combinations and the additional possibility that there is no error, M should be at least 2n(k+1)(q−1)+1. Preferably, M should be chosen substantially larger than 2n(k+1)(q−1)+1. Suitable constants a[0], ..., a[k−1] can be found by iteratively selecting and testing randomly chosen values, and this is easier if M is larger.

In a preferred embodiment, a table is used that associates s(e) with (i, j, d). For example, the table may have a row for each possible value of s(e). The row then stores this value in a first field and stores in three additional fields of the row the values for i, j, and d. The lookup in the table may be done in any suitable way. Clearly it is preferred not to have rows in the table for values of "s(e)" that actually cannot occur since then the table could become rather large. So, it is preferred to have no invalid rows. As a consequence the actual value of s(e) can not be used to index the row number. Techniques for efficiently locating a row in such a situation are generally known, for example using hashing, or by binary search. If so desired a table may be used indexed by the entire range {0 ... M−1}.

Thus, first the syndrome is calculated for the received vector x. If the outcome of the syndrome is zero, there is no error and the vector x is actually the code word u. It is sufficient to remove the parity symbol u[k] and issue x[0], ..., x[k−1]=u[0], ..., u[k−1]. If the syndrome value is non-zero there is an error. Preferably, the described table T is used that associates each possible outcome of the syndrome to a respective set (i, j, d). This is shown in step 270 of FIG. 2B and step 350 of FIG. 3. This gives then values for i, j, and d. With this information, the j-th q-ary symbol in the i-th information symbol x[i] is corrected based on the value d. It is recalled that d is the difference caused by the error in the transmission channel. By subtracting d from the identified q-ary symbol the error is corrected. It will be understood that equally a system can be defined wherein the error is corrected in another way, e.g. by adding d.

Persons skilled in the art can easily see that the same principle can also be applied for two or more q-ary-symbol errors. However, the table of the syndrome values grows exponentially in the number of errors. So this limits the practical use for multiple q-ary-symbol errors.

A Real Design Example

The method and system according to the invention are further illustrated by an example that is also suitable for use with a NAND-flash memory. The memory device at hand is organized in pages of 512 Byte of information to be protected by 16 Bytes of parity.

The memory cells are used with q=4 levels. The processor that is used for executing the error-correction method is an ARM720T type of processor with a w=32 bit architecture.

In the first design step, a memory page is split into eight identical ECC-blocks, each of which contain 64 Bytes of information protected by two Bytes of parity. 64 Bytes equal k=16 words of w=32 bits each. In this example, the code is used for correcting a maximum of one 4-ary symbol error. The given splitting maximizes the number of errors that can be corrected in total.

In the second step, the modulus is chosen as M=65521, which is the largest prime not exceeding $2^{16}$ (=range of the two parity bytes.) In general, the modulus does not have to be prime but it simplifies the design of the coefficients.

In the third step, coefficients a[0], ..., a[15] are chosen in {1 ... M} such that the possible syndromes in (2) are pairwise distinct and non-zero. In a preferred embodiment, the coefficients are chosen by trying random values. If a set of values is found that meets the requirements, a working error correcting code has been found.

In a preferred embodiment, constants are chosen that can also be executed relatively fast by the chosen integer processor. The described ARM processor can execute the multiplications in (1) much faster if the constant values are 8-bit values (using 8×32 bit multiplication) then if the constants are 32 bit values (giving a 16×32 bit multiplication). Preferably, fast executable constants are chosen by starting with an upper boundary for the constant values of A, where initially A=M. If for the boundary A a set of constants is found, the limit A is lowered until no solution is found after a reasonable amount of random trials (e.g. $10^4$).

Using above technique, one particular solution for the described exemplary system is:

$$a=(26, 42, 53, 55, 74, 77, 99, 119, 140, 149, 162, 197, 201, 204, 223, 233; 1).$$

Thus, a[0]=26, a[1]=42, etc. Using this method, has given 8-bit wide coefficients enabling very fast multiplication.

In above example, the reduction is preferably mod 65521 (the largest prime not exceeding $2^{16}$). This reduction can also be executed fast in software on a conventional integer processor. It will be observed that M=$2^{16}$−15=65521. The expression for s(x), before reduction modulo M, yields a value in the range {0 ... 16*255*($2^{32}$−1)+M−1}, which is contained in {0 ... $2^{44}$−1}. Hence, s(x) can be written as:

$$s(x)=s0+s1\, 2^{16}+s2\, 2^{32}, \text{ where } s0, s1, s2 \text{ in } \{0 \ldots 2^{16}-1\}.$$

Now the reduction of this expression modulo M can be computed using shifts and additions. In the description, the notation (x<<k) denotes x shifted left by k bits, i.e., (x<<k)=x*$2^k$, and (x>>k) denotes x shifted right by k bits.

Then the reduction can be computed as follows:

```
t1 = (s1 << 4) − s1;           t1 = 15 * s1, congruent to s1 2^16 mod M
t2 = (s2 << 8) −                t2 = 225 * s1, congruent to s2 2^32 mod M
(s2 << 5) + s2;
t = s0 + t1 + t2;               t in {0..1966560}, congruent to s(x) mod M
u0 + u1 2^16 = t;               u0, u1 are the lower and upper 16-bit of t
v = u0 + (u1 << 4) − u1;        v < 2 * M
if v >= 65521    then s(x) = v − 65521
                 else s(x) = v.
```

This costs a total of four shifts, at most eight additions and one IF with comparison.

It will be appreciated that the invention also extends to computer programs, particularly computer programs on or in a carrier, adapted for putting the invention into practice. The program may be in the form of source code, object code, a code intermediate source and object code such as partially compiled form, or in any other form suitable for use in the implementation of the method according to the invention. The carrier be any entity or device capable of carrying the program. For example, the carrier may include a storage medium, such as a ROM, for example a CD ROM or a semiconductor ROM, or a magnetic recording medium, for example a floppy disc or hard disk. Further the carrier may be a transmissible carrier such as an electrical or optical signal that may be conveyed via electrical or optical cable or by radio or other means. When the program is embodied in such a signal, the carrier may be constituted by such cable or other device or means. Alternatively, the carrier may be an integrated circuit in which the program is embedded, the integrated circuit being adapted for performing, or for use in the performance of, the relevant method.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A method of generating an error correcting code for correcting at least one q-ary symbol, where q is an $r^{th}$ power of two, $r \geq 1$, ($q=2^r$); the method includes:
   using as the error correcting code a code word u that includes k information symbols $u[0], \ldots, u[k-1]$, $k \geq 1$ and a parity symbol $u[k]$ for protecting the information symbols (for example, $u=(u[0], \ldots, u[k-1], u[k])$); each information symbol representing an integer in the range $\{0, \ldots 2^w-1\}$, where $w=n*r$, $n \geq 1$;
   including in the parity symbol $u[k]$ a term $-(a[0] \cdot u[0]+a[1] \cdot u[1]+ \ldots +a[k-1] \cdot u[k-1]) \bmod M$, where $M \geq 2n(k+1)(q-1)+1$ where the multiplication · and the addition + are integer operations executable by an integer processing unit and where $a[0], \ldots, a[k-1]$ are constants in $\{0, \ldots, M-1\}$; and
   choosing the constants $a[0], \ldots, a[k-1]$ such that the elements $a[i] \cdot d \cdot q^j \bmod M$ are pairwise distinct for $i \in \{0, \ldots, k\}$, $j \in \{0, \ldots n-1\}$, $-q<d<q$, $d \neq 0$, where $a[k]=1$.

2. A method as claimed in claim 1, including forming a table T for correcting a single error in a q-ary symbol of a received vector x that includes the code word u and an error vector e, where $x=u+e=(u[0]+e[0], \ldots, u[k-1]+e[k-1], u[k]+e[k])$ and the addition + is an integer operation executable by an integer processing unit; the table associating all possible outcomes of a syndrome $s(x)=(a[0] \cdot x[0]+a[1] \cdot x[1]+ \ldots +a[k-1] \cdot x[k-1]+x[k]) \bmod M$ to a respective set (i, j, d) to enable correction of the j-th q-ary symbol in the i-th information symbol x[i] based on the value d.

3. A method as claimed in claim 1, wherein $w>1$, including choosing as the modulus M a largest prime number smaller than $2^w$.

4. A method as claimed in claim 1, including choosing the constants $a[0], \ldots, a[k-1]$ by randomly selecting values for the constants $a[0], \ldots, a[k-1]$ until at least one set of constants has been found for which the elements $a[i] \cdot d \cdot q^j \bmod M$ are pairwise distinct for $i \in \{0, \ldots, k\}$, $j \in \{0, \ldots, n-1\}$, $-q<d<q$, $d \neq 0$.

5. A method as claimed in claim 4, including:
   choosing an initial upper boundary $A=M$ for each of the constants $a[0], \ldots, a[k-1]$;
   randomly selecting values for the constants $a[0], \ldots, a[k-1]$;
   verifying whether the elements $a[i] \cdot d \cdot q^j \bmod M$ are pairwise distinct for $i \in \{0, \ldots, k\}$, $j \in \{0, \ldots, n-1\}$, $-q<d<q$, $d \neq 0$;
   upon a positive outcome of the verification, lowering the boundary A and repeating the selecting and verification, and upon a negative outcome for a predetermined number of successive verifications using for the constants the randomly selected values that gave the last positive outcome of the verification.

6. A method of protecting a codeword u against an error in at least one q-ary symbol, where q is an $r^{th}$ power of two, $r \geq 1$ ($q=2^r$), the method including:
   receiving the code word u including information symbols $u[0], \ldots, u[k-1]$, $k>1$, each information symbol representing an integer in the range $\{0, \ldots, 2^w-1\}$, where $w=n*r$, $n \geq 1$;
   calculating a parity symbol $u[k]$ for protecting the information symbols, where the parity symbol includes $-(a[0] \cdot u[0]+a[1] \cdot u[1]+ \ldots +a[k-1] \cdot u[k-1]) \bmod M$, where $M \geq 2n(k-1)(q-1)+1$ and where the multiplication · and the addition + are integer operations executable by an integer processing unit and where $a[0], \ldots, a[k-1]$ are constants in $\{0, \ldots, M-1\}$ chosen such that the elements $a[i] \cdot d \cdot q^j \bmod M$ are pairwise distinct for $i \in \{0, \ldots, k\}$, $j \in \{0, \ldots n-1\}$, $-q<d<q$, $d \neq 0$, where $a[k]=1$; and
   adding the parity symbol $u[k]$ to the codeword u before transmitting or storing the codeword.

7. A method of correcting a single error in a q-ary symbol of a received vector x that includes a code word u and an error vector e, where $x=u+e=(u[0]+e[0], \ldots, u[k-1]+e[k-1], u[k]+e[k])$ and the addition + is an integer operation executable by an integer processing unit; the code word u including information symbols $u[0], \ldots, u[k-1]$, $k>1$, and a parity symbol $u[k]$ for protecting the information symbols; each information symbol representing an integer in the range $\{0, \ldots, 2^w-1\}$, where $w=n*r$, $n \geq 1$ and the parity symbol including:
$-(a[0] \cdot u[0]+a[1] \cdot u[1]+ \ldots +a[k-1] \cdot u[k-1]) \bmod M$, where $M \geq 2n(k-1)(q-1)+1$, where the multiplication ⌴ and the addition + are integer operations executable by an integer processing unit and where $a[0], \ldots, a[k-1]$ are constants in $\{0, \ldots, M-1\}$ chosen such that the elements $a[i] \cdot d \cdot q^j \bmod M$ are pairwise distinct for $i \in \{0, \ldots, k\}$, $j \in \{0, \ldots, n-1\}$, $-q<d<q$, $d \neq 0$, where $a[k]=1$;
the method including:
   calculating a syndrome $s(x)=(a[0] \cdot x[0]+a[1] \cdot x[1]+ \ldots +a[k-1] \cdot x[k-1]+x[k]) \bmod M$; and
   if the outcome of the syndrome is non-zero:
      using a table T that associates each possible outcome of the syndrome to a respective set (i, j, d) to determine values of (i, j, d) for the calculated syndrome; and
      correcting the j-th q-ary symbol in the i-th information symbol x[i] based on the value d.

8. A system for protecting a codeword u against an error in at least one q-ary symbol, where q is an $r^{th}$ power of two, $r \geq 1$ ($q=2^r$), the system including:
   means for receiving the code word u including information symbols $u[0], \ldots, u[k-1]$, $k>1$, each information symbol representing an integer in the range $\{0, \ldots, 2^w-1\}$, where $w=n*r$, $n \geq 1$;
   a processor including an integer processing unit for, under control of a program, calculating a parity symbol $u[k]$ for protecting the information symbols, where the parity symbol includes $-(a[0] \cdot u[0]+a[1] \cdot u[1]+ \ldots +a[k-1] \cdot u[k-1]) \bmod M$, where $M \geq 2n(k-1)(q-1)+1$, where the multiplication · and the addition + are integer operations and where $a[0], \ldots, a[k-1]$ are constants in $\{0, \ldots, M-1\}$ chosen such that the elements $a[i] \cdot d \cdot q^j \bmod M$ are pairwise distinct for $i \in \{0, \ldots, k\}$, $j \in \{0, \ldots, n-1\}$, $-q<d<q$, $d \neq 0$; and means for adding the parity symbol u[k] to the codeword u before transmitting or storing the codeword.

9. A system as claimed in claim 8, wherein the system includes:

means for receiving or reading a vector x that includes the code word u and an error vector e, where x=u+e=(u[0]+e[0], ..., u[k−1]+e[k−1], u[k]+e[k]) and the addition + is an integer operation;

the processor being operative for, under control of a program, correcting a single error in a q-ary symbol of the received vector x by:

calculating a syndrome s(x)=(a[0]·x[0]+a[1]·x[1]+ ... + a[k−1]·x[k−1]+x[k]) mod M; and if the outcome of the syndrome is non-zero:

using a table T that associates each possible outcome of the syndrome to a respective set (i, j, d) to retrieve a set of values (i, j, d) for the calculated syndrome; and correcting the j-th q-ary symbol in the i-th information symbol x[i] based on the value d.

10. A system as claimed in claim 8, wherein the system includes a memory for storing the code word u where individual memory cells of the memory are physically arranged to store a single q-ary symbol, where q>2.

11. A system as claimed in claim 10, wherein the memory is of a NAND-flash type.

\* \* \* \* \*